United States Patent
Refaeli et al.

(10) Patent No.: US 10,802,932 B2
(45) Date of Patent: Oct. 13, 2020

(54) DATA PROCESSING SYSTEM HAVING LOCKSTEP OPERATION

(71) Applicant: NXP USA, INC., Austin, TX (US)

(72) Inventors: Jehoda Refaeli, Austin, TX (US); Nancy Hing-Che Amedeo, Austin, TX (US); Larry Alan Woodrum, Austin, TX (US)

(73) Assignee: NXP USA, Inc., Austin, TX (US)

( * ) Notice: Subject to any disclaimer, the term of this patent is extended or adjusted under 35 U.S.C. 154(b) by 267 days.

(21) Appl. No.: 15/830,154

(22) Filed: Dec. 4, 2017

(65) Prior Publication Data

US 2019/0171536 A1    Jun. 6, 2019

(51) Int. Cl.
| | |
|---|---|
| *G06F 11/16* | (2006.01) |
| *G06F 11/20* | (2006.01) |
| *G01R 31/3177* | (2006.01) |
| *G11C 29/38* | (2006.01) |

(52) U.S. Cl.
CPC ........... *G06F 11/203* (2013.01); *G06F 11/16* (2013.01); *G06F 11/165* (2013.01); *G06F 11/1629* (2013.01); *G06F 11/1641* (2013.01); *G06F 11/1695* (2013.01); *G01R 31/3177* (2013.01); *G06F 2201/805* (2013.01); *G06F 2201/82* (2013.01); *G11C 29/38* (2013.01)

(58) Field of Classification Search
CPC ... G06F 11/203; G06F 11/1641; G06F 11/165
See application file for complete search history.

(56) References Cited

U.S. PATENT DOCUMENTS

| | | |
|---|---|---|
| 5,276,823 A | 1/1994 | Cutts, Jr. et al. |
| 5,699,279 A | 12/1997 | Widigen et al. |
| 5,838,899 A | 11/1998 | Leavitt et al. |
| 6,073,251 A | 6/2000 | Jewett et al. |
| 6,874,052 B1 | 3/2005 | Delmonico et al. |
| 6,880,086 B2 | 4/2005 | Kidder et al. |
| 6,934,749 B1 | 8/2005 | Black et al. |
| 6,938,183 B2 | 8/2005 | Bickel |
| 6,948,092 B2 | 9/2005 | Kondo et al. |
| 6,985,975 B1 | 1/2006 | Chamdani et al. |

(Continued)

FOREIGN PATENT DOCUMENTS

| | | |
|---|---|---|
| CA | 2718136 A1 | 10/2008 |
| CA | 2694198 C | 1/2009 |

(Continued)

OTHER PUBLICATIONS

U.S. Appl. No. 15/172,704, filed Jun. 3, 2016, titled "Method and Apparatus for Managing Mismatches Within a Multi-Threaded Lockstep Processing System".

*Primary Examiner* — Jonathan D Gibson (57) ABSTRACT

A data processing system and methods for operating the same are disclosed. The method includes detecting a fault by comparing output signals from a first processing core and a second processing core, entering a safe mode based upon detecting the fault, completing transactions while in the safe mode, and determining whether the fault corresponds to a hard error. Based upon the fault corresponding to a hard error, one of processing cores is identified as a faulty core. The faulty core is inhibited from executing instructions and the other processing core is allowed to execute instructions.

20 Claims, 4 Drawing Sheets

(56) References Cited

U.S. PATENT DOCUMENTS

| | | |
|---|---|---|
| 7,020,696 B1 | 3/2006 | Perry et al. |
| 7,143,153 B1 | 11/2006 | Black et al. |
| 7,225,244 B2 | 5/2007 | Reynolds et al. |
| 7,240,364 B1 | 7/2007 | Branscomb et al. |
| 7,263,597 B2 | 8/2007 | Everdell et al. |
| 7,266,595 B1 | 9/2007 | Black et al. |
| 7,349,960 B1 | 3/2008 | Pothier et al. |
| 7,693,976 B2 | 4/2010 | Perry et al. |
| 7,818,500 B2 | 10/2010 | Ray et al. |
| 7,987,385 B2 | 7/2011 | Pruiett et al. |
| 8,447,897 B2 | 5/2013 | Xu et al. |
| 8,635,492 B2 | 1/2014 | Gara et al. |
| 8,819,485 B2 * | 8/2014 | Vilela ............... G06F 11/0763 714/11 |
| 9,122,698 B2 | 9/2015 | Lacapra et al. |
| 9,130,566 B1 | 9/2015 | Ahmad et al. |
| 9,171,585 B2 | 10/2015 | Rajan et al. |
| 9,361,170 B2 | 6/2016 | Bellocchio et al. |
| 9,362,902 B2 | 6/2016 | Snook et al. |
| 9,417,946 B2 | 8/2016 | Vilela et al. |
| 9,460,020 B2 | 10/2016 | Gschwind et al. |
| 9,495,202 B2 | 11/2016 | Gschwind et al. |
| 9,584,432 B2 | 2/2017 | Welin et al. |
| 9,705,680 B2 | 7/2017 | Gschwind et al. |
| 10,303,566 B2 * | 5/2019 | Ozer ............... G06F 11/1641 |
| 2002/0001307 A1 | 1/2002 | Nguyen et al. |
| 2002/0057018 A1 | 5/2002 | Branscomb et al. |
| 2002/0116485 A1 | 8/2002 | Black et al. |
| 2002/0165961 A1 | 11/2002 | Everdell et al. |
| 2003/0120822 A1 | 6/2003 | Langrind et al. |
| 2004/0193735 A1 | 9/2004 | Peleska et al. |
| 2005/0283712 A1 * | 12/2005 | Mukherjee ............... G06F 11/10 714/764 |
| 2009/0177866 A1 * | 7/2009 | Choate ............... G06F 11/1687 712/200 |
| 2009/0217092 A1 | 8/2009 | Weiberle et al. |
| 2010/0005218 A1 | 1/2010 | Gower et al. |
| 2012/0210162 A1 * | 8/2012 | Gara ............... G06F 11/1064 714/6.1 |
| 2012/0272006 A1 * | 10/2012 | Moyer ............... G06F 11/1658 711/125 |
| 2013/0024721 A1 * | 1/2013 | Kabulepa ............... G06F 11/165 714/5.1 |
| 2013/0238945 A1 * | 9/2013 | Vilela ............... G06F 11/0763 714/49 |
| 2014/0337670 A1 | 11/2014 | Vilela et al. |
| 2014/0346893 A1 | 11/2014 | Snook et al. |
| 2016/0196193 A1 | 7/2016 | Gschwind et al. |
| 2016/0248631 A1 | 8/2016 | Duchesneau |
| 2016/0283314 A1 * | 9/2016 | Thanner ............... G06F 11/0793 |
| 2016/0350124 A1 | 12/2016 | Gschwind et al. |
| 2017/0083442 A1 | 3/2017 | Busaba et al. |
| 2017/0090977 A1 | 3/2017 | Bradbury et al. |
| 2017/0182859 A1 | 6/2017 | Anderson et al. |
| 2017/0192893 A1 | 7/2017 | Gschwind et al. |
| 2017/0357557 A1 * | 12/2017 | Jain ............... G06F 11/1641 |
| 2019/0012242 A1 * | 1/2019 | Ozer ............... G06F 11/10 |

FOREIGN PATENT DOCUMENTS

| | | |
|---|---|---|
| WO | 2005101996 A2 | 11/2005 |
| WO | 2007094808 A1 | 8/2007 |
| WO | 2014145018 A2 | 9/2014 |

\* cited by examiner

DATA PROCESSING SYSTEM HAVING LOCKSTEP OPERATION

BACKGROUND

Field

This disclosure relates generally to data processing systems, and more specifically, to a data processing system having lockstep operation.

Related Art

As time advances, integrated circuits continue to increase in complexity. System-on-Chip (SoC) and other multiple-core integrated circuits are being developed in order to support various applications such as automotive, industrial, and medical applications, for example. Systems designed for these applications often require significant attention to safety. Accordingly, improved safety processing techniques are desired.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a data processing system and method for operating in a lockstep mode. Output signals from two processing cores of a core domain are compared during a lockstep mode. When a fault is detected, the core domain enters a safe mode and a determination is made whether the fault is caused by a soft error or a hard error. While in the safe mode, the core domain is isolated from a system bus of the data processing system after outstanding transactions are completed. The fault is analyzed by performing a memory built-in self-test (MBIST) on a cache memory coupled to a processor of each processing core and a logic built-in self-test (LBIST) on the processor of each processing core. A hard error is determined when MBIST or LBIST fails and a soft error is determined when MBIST and LBIST both pass. When a hard error is determined, fault analysis also identifies which core is a faulty core.

Based upon the fault corresponding to hard error, the faulty core is inhibited and the non-faulty core is allowed to continue operation. By inhibiting the faulty core and allowing the non-faulty core to continue executing, the data processing system can continue operation in a reduced or degraded operating mode which is desirable in a safety application. Based upon the fault corresponding to a soft error, a reset of the core domain is performed while other portions of the data processing system are allowed to operate normally. Because the reset of the core domain does not impact other portion of the data processing system, significant downtime savings can be achieved which is also desirable in a safety application.

Figure 1:
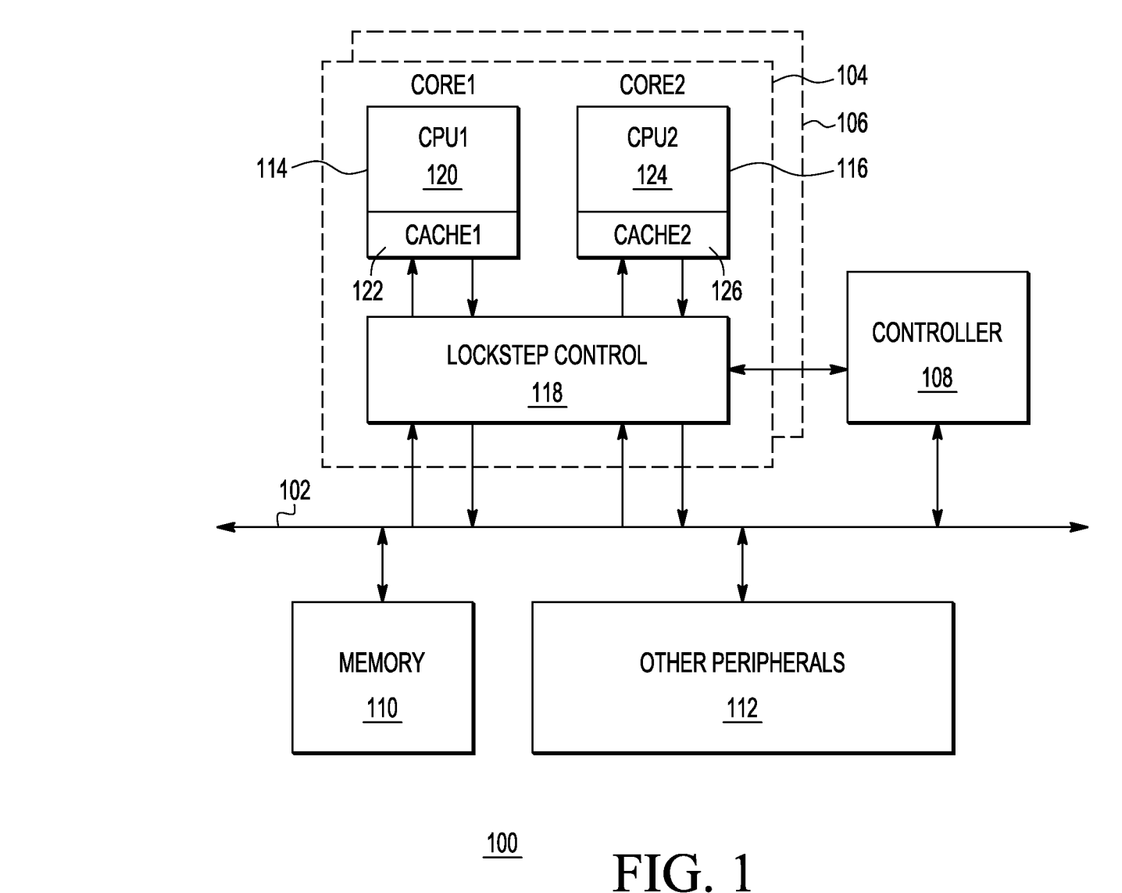
FIG. 1 illustrates, in simplified block diagram form, an exemplary data processing system in accordance with an embodiment of the present invention.

FIG. 1 illustrates, in simplified block diagram form, an exemplary data processing system 100 in accordance with an embodiment of the present invention. In some embodiments, data processing system 100 may be characterized as a system-on-a-chip (SoC). Processing system 100 includes system bus 102, core domains 104 and 106, controller 108, memory 110, and other peripherals 112. Core domain 104 includes processing cores 114 and 116, and lockstep control block 118. Lockstep control block 118, controller 108, memory 110, and other peripherals 112 are each bidirectionally coupled to system bus 102 by way of respective communication buses. Cores 114 and 116 are each bidirectionally coupled to system bus 102 by way of lockstep control block 118 and respective communication buses.

System bus 102 may include any type of bus, switch fabric, network on chip (NoC), and the like for interconnecting and communicating any type of information such as data, address, instructions, interrupts, and control. System bus 102 provides a communication backbone for transactions such as writes to memory, data transfers, etc., as well as communication of other information. In particular, system bus 102 provides a communication backbone for transactions among core domains 104 and 106, controller 108, memory 110, and other peripherals 112.

Core domain 104 include cores 114 and 116 which are coupled to system bus 102 by way of lockstep control block 118. Processing cores 114 and 116 each include a processor (120, 124) and cache memory (122, 126) respectively. Processor 120 labeled CPU1 is coupled to cache memory 122 labeled CACHE1, and processor 124 labeled CPU2 is coupled to cache memory 126 labeled CACHE2. Test circuitry such as logic built-in self-test (LBIST) is coupled to each of CPU1 and CPU2, and memory built-in self-test (MBIST) is coupled to each of CACHE1 and CACHE2. CPU1 and CPU2 may include any type of circuits for processing, computing, etc., such as state machine, microprocessor unit (MPU), microcontroller unit (MCU), digital signal processor (DSP), and other suitable types of processing units. In this embodiment, cores 114 and 116 are virtually identical to one another having like architecture and circuitry, for example.

Processing system 100 may include multiple core domains like core domain 104 (e.g., core domain 106), each core domain including processing cores like cores 114 and 116, shared memory (not shown), lockstep control circuitry like lockstep control block 108, interrupt circuitry (not shown), and other periphery. For example, core domain 106 may be similar to core domain 104 including circuitry like cores 114 and 116, lockstep control block 118, and so on. Core domain 106 may operate independently from core domain 104 such as in multi-processing or multi-threaded processing systems. In some embodiments, core domain 106 may have different cores, memory, and other circuitry. In some embodiments, cores 114 and 116 in core domain 104 may each include multiple cores like cores 114 and 116. For example, core 114 may include two cores having two processors like CPU1 coupled to two cache memories like CACHE1, and core 116 may include two cores having two processors like CPU2 coupled to two cache memories like CACHE2.

Cores 114 and 116 are generally configured to execute sets of instructions in order to carry out designated tasks. In the course of executing instructions, cores 114 and 116 can generate transactions such as writes to memory, data transfers, etc. Cores 114 and 116 may be configured to operate independently in a performance mode or may be configured to operate together in a lockstep mode. Cores 114 and 116 may also be configured to operate in a degraded mode where one core is disabled and the other core operates independently. In the lockstep mode, one core may shadow the other by executing the same instructions and generating the same transactions. For example, core 114 labeled CORE1 and core 116 labeled CORE2 may be configured to operate in a lockstep mode (e.g., as a lockstep pair) using the lockstep control block 118 such that CORE2 shadows CORE1, allowing outputs of each core to be compared with one another for inconsistencies. By comparing outputs of the lockstep pair, a level of safety in data processing system 100 can be assured because hard and soft errors are detectable. In this embodiment, when CORE2 shadows CORE1, outputs of CORE2 are used only for comparison and are decoupled from system bus 102 accordingly. The term "shadows," as used herein, refers to executing the same instructions and generating the same transactions.

Lockstep control block 118 includes circuitry configured to selectively route signals between CORE1 and CORE2 and system bus 102 based on control signals provided by controller 108. Lockstep control block 118 includes inputs and outputs coupled to provide and receive signals to and from CORE1 and CORE2, system bus 102, and controller 108. Lockstep control block 118 also includes circuitry configured to compare output signals from each core of CORE1 and CORE2 to determine whether such output signals are consistent with one another. A set of control signals are transmitted by way of control signal lines coupled between controller 108 and lockstep control block 118.

Controller 108 is coupled to system bus 102 and lockstep control block 118. Controller 108 includes circuitry for processing, computing, etc., such as a state machine, processing core, and the like. Controller 108 is generally configured to execute instructions and provide responses to received interrupt signals in order to carry out designated tasks. Controller 108 is configured to provide control signals to the lockstep control block 118 and configured to receive fault indication signals and/or interrupt signals from the lockstep control block 118.

Memory 110 may include any type of volatile or non-volatile memory array cells, such as static random-access memory (SRAM), dynamic random-access memory (DRAM), flash memory, and the like. Processing system 100 may include multiple memories like memory 110 or a combination of different memory types. For example, processing system 100 may include a flash memory in addition to an SRAM 110.

Other peripherals 112 of processing system 100 may include any number of other circuits and functional hardware blocks such as accelerators, timers, counters, communications, interfaces, analog-to-digital converters, digital-to-analog converters, PLLs, and the like for example. Each of the other circuits and functional hardware blocks included in other peripherals 112 may be coupled to system bus 102 by way of respective communication buses.

Figure 2:
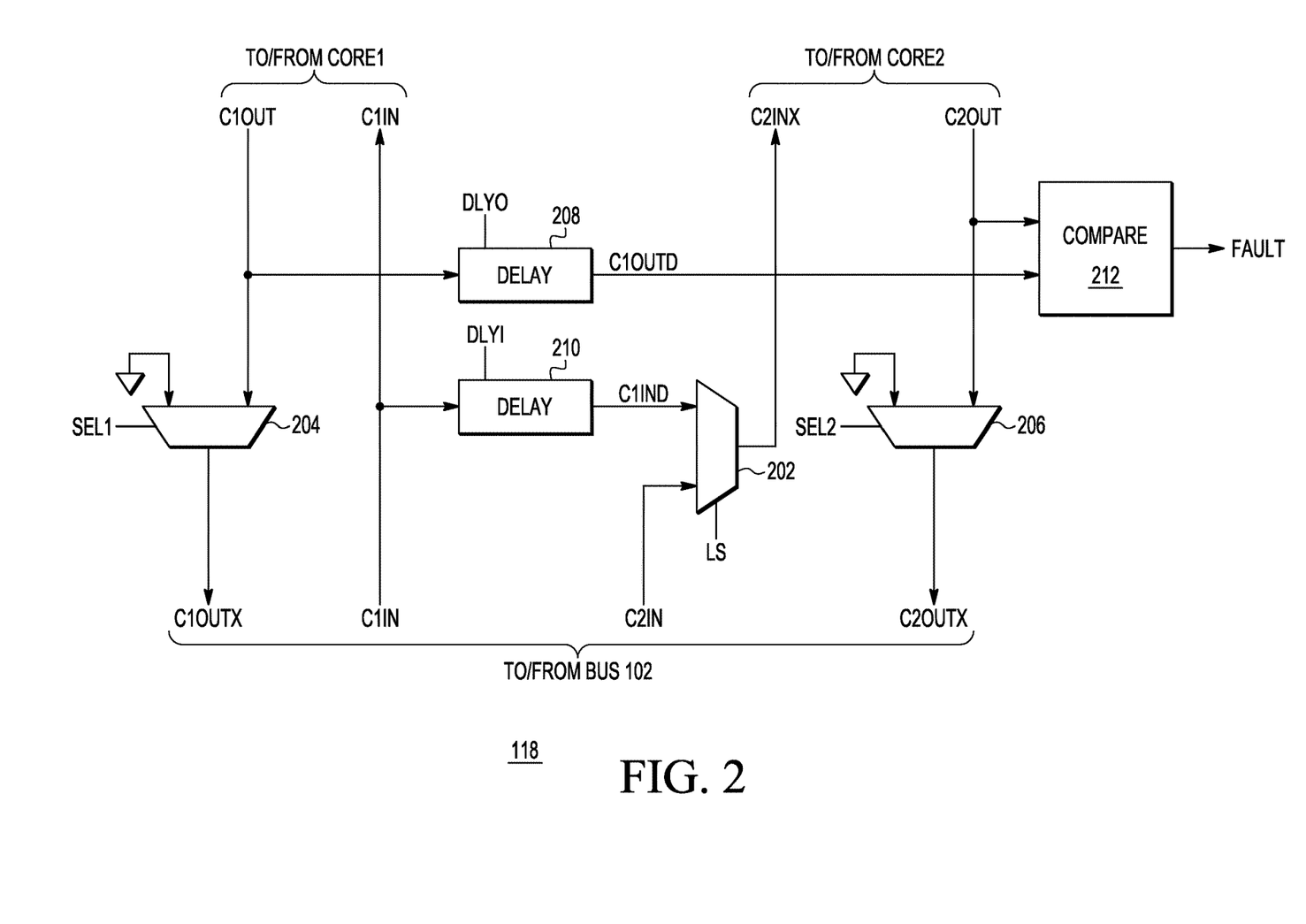
FIG. 2 illustrates, in simplified schematic diagram form, an exemplary lockstep control block in accordance with an embodiment of the present invention.

FIG. 2 illustrates, in simplified schematic diagram form, an exemplary lockstep control block 118 of FIG. 1 in accordance with an embodiment of the present invention. Lockstep control block 118 includes inputs labeled C1IN and C2IN for receiving signals from system bus 102, inputs labeled C1OUT and C2OUT for receiving output signals from CORE1 and CORE2, outputs labeled C1OUTX and C2OUTX for providing output signals to system bus 102, and outputs labeled C1IN and C2INX for providing input signals to CORE1 and CORE2. Lockstep control block 118 also includes control inputs labeled SEL1, SEL2, and LS for receiving control signals from controller 108, and control outputs labeled FAULT for providing one or more fault indication signals and/or interrupt signals to controller 108. In this embodiment, lockstep control block 118 includes multiplexer circuits 202-206, delay circuits 208 and 210, and compare unit 212.

Delay circuits 208 and 210 may be configured to delay a respective signal by a predetermined fixed delay amount. The fixed delay amount may be represented by a value from 0 (zero) to N, where 0 corresponds to no delay and N corresponds to N number of clock cycle delays. In some embodiments, delay circuits 208 and 210 may be configured to delay a respective signal by a programmable delay amount by way of control signal inputs (e.g., DLYI, DLYO). For example, delay circuit 208 may be programmed to delay a signal by a predetermined amount (e.g., two clock cycles) based on control signal values provided by controller 108. The programmable delay amount may also be represented by a value from 0 (zero) to N, where 0 corresponds to no delay and N corresponds to N number of clock cycle delays.

Multiplexer circuits 202-206 may each be configured to select one of multiple inputs to be routed to an output based on a value of a control signal. In this embodiment, each of multiplexer circuits 202-206 are configured as a two-input, one-output switch circuit. Multiplexer circuits 202-206 may also be referred to as selector circuits. Other multiplexer circuit configurations and arrangements may be used in other embodiments.

Multiplexer circuits 202-206 are coupled to receive control signals LS, SEL1, and SEL2 to route selected inputs to respective multiplexer outputs. Each of control signals LS, SEL1, and SEL2 may have values corresponding to operating modes of the CORE1 and CORE2. For example, in a lockstep mode where CORE2 shadows CORE1, control signals LS, SEL1, and SEL2 may each be set to a first value allowing input signals C1IN to be routed to CORE1 and CORE2 by way of multiplexer 202, output signals C1OUT from CORE1 routed to system bus 102 by way of multiplexer 204, and output signals C2OUT from CORE2 to be inhibited by way of multiplexer 206. Because the same input signals are routed to both CORE1 and CORE2, output signals from both CORE1 and CORE2 may be compared with one another in the compare unit 212.

In a performance mode where CORE1 and CORE2 operate independently, control signals LS and SEL2 may each be set to a second value (while SEL1 is set to the first value) allowing C2IN input signals to be routed to CORE2 and output signals C2OUT to be routed to system bus 102. In a first degraded mode, CORE1 is inhibited and CORE2 is operable. Control signals LS, SEL1, and SEL2 may each be set to the second value allowing C21N input signals to be routed to CORE2 and output signals C2OUT to be routed to system bus 102 while CORE1 output signals C1OUT are inhibited at multiplexer 204. In a second degraded mode, CORE1 is operable and CORE2 is inhibited. Control signals SEL1 and SEL2 may each be set to the first value (while LS is set to the second value) allowing output signals C1OUT to be routed to system bus 102 while CORE2 output signals C2OUT are inhibited at multiplexer 206. When in the first or second degraded mode, the level of safety in data processing system 100 may be reduced because hard and soft errors are not as readily detectable as they were in lockstep mode.

Compare unit 212 includes inputs for receiving a first group of signals (e.g., C1OUTD) and a second group of signals (e.g., C2OUT), and one or more outputs for providing one or more fault indication signals (e.g., FAULT). Compare unit 212 includes circuitry configured to compare the first group of signals with the second group of signals and generate a fault indication when a mismatch occurs. In general, the first and second groups of signals are expected to be identical. However, a fault (also referred to as error condition) may occur in which one of the signals in the first group is different from a corresponding signal in the second group, and thus a fault indication is generated. The fault indication may be in the form of a flag, signal, and/or interrupt request by which controller 108 responds with further action.

Figure 3:
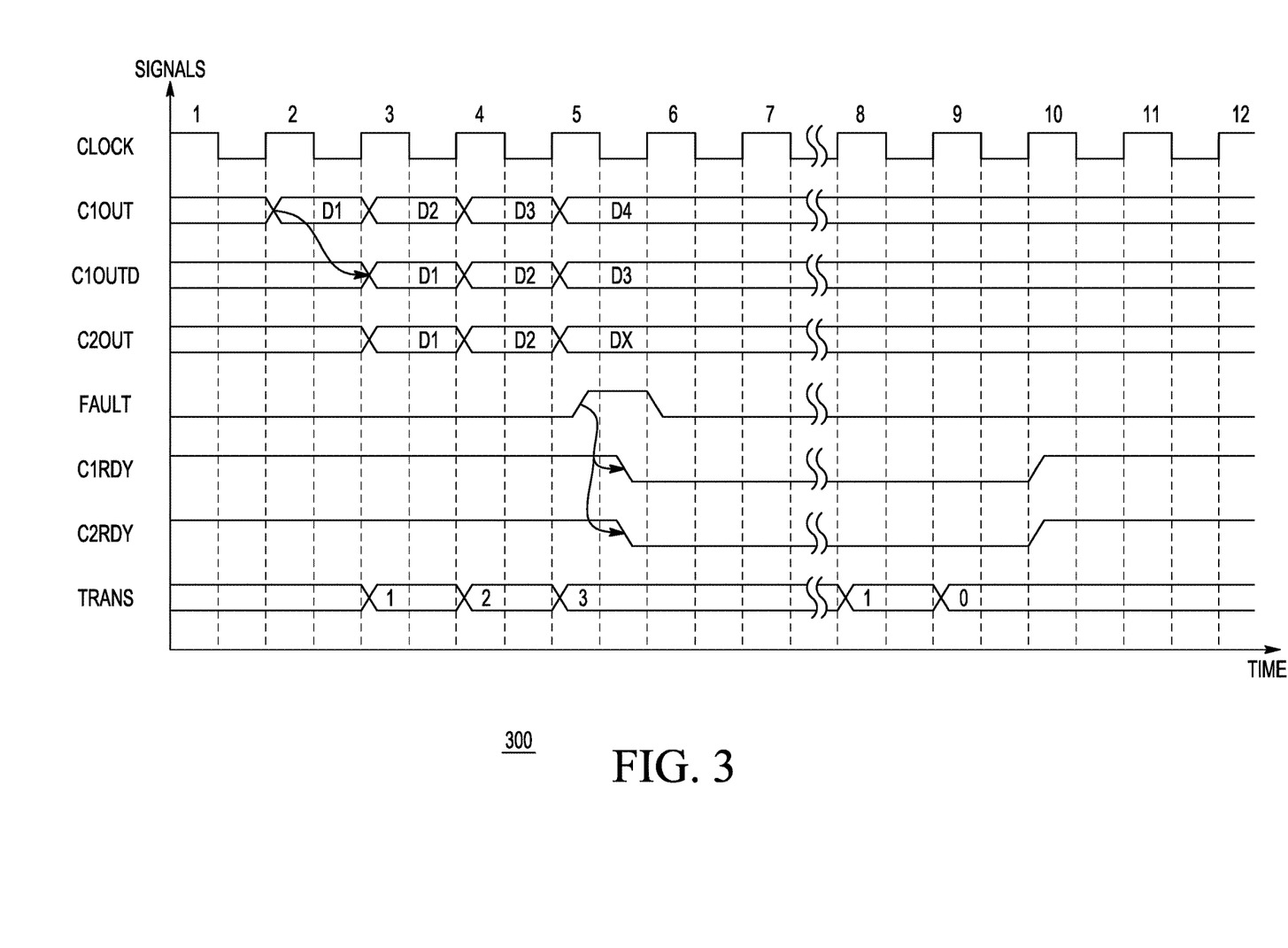
FIG. 3 illustrates, in timing diagram form, exemplary lockstep fault signal timing in accordance with an embodiment of the present invention.

FIG. 3 illustrates, in simplified timing diagram form, exemplary lockstep fault signal timing 300 in accordance with an embodiment of the present invention. Various signals are shown on the Y axis versus time shown on the X axis. By way of example, lockstep operation corresponding to FIGS. 1 and 2 is depicted in timing diagram 300. CLOCK signal waveform includes numbered clock cycles for reference. In the embodiment depicted in FIG. 3, CORE1 and CORE2 of core domain 116 are operating in a lockstep mode whereby CORE2 shadows CORE1. In this embodiment, input signals C1IN are routed to CORE1. C1IN signals are delayed by one clock cycle to form C1IND signals which are routed to CORE2. Thus, CORE2 operates one clock cycle later in time based on the same input signals as CORE1. Accordingly, CORE1 output signals C1OUT are delayed by one clock cycle to form C1OUTD signals to be compared with CORE2 output signals C2OUT.

At clock cycle 3, C1OUTD waveform is depicted as a one clock cycle delay of the C1OUT waveform. For example, C1OUT signals include data value labeled D1 in clock cycle 2 and the delayed signals C1OUTD include data value D1 in clock cycle 3. Because input signals to CORE2 are delayed by one clock cycle (C1IND), CORE2 outputs signals C2OUT are temporally aligned with C1OUTD signals. As such, C1OUTD and C2OUT signals are compared with one another in the compare unit 212. For example, in clock cycles 3 and 4, output signals C2OUT match with C1OUTD signals and do not generate a fault indication (FAULT). However, in clock cycle 5, C1OUTD signals include data value D3 while C2OUT signals include data value DX which is detected as a fault thus generating a fault indication as a logic high signal on the FAULT waveform. In turn, the rising edge of the fault indication on the FAULT waveform causes ready signals (C1RDY, C2RDY) to de-assert for both CORE1 and CORE2. With both C1RDY and C2RDY signals de-asserted, core domain 104 can transition into a safe mode.

While in the safe mode, CORE1 and CORE2 are isolated from the system bus 102 and allowed to complete any outstanding transactions. Outstanding transactions may include a load or store requests targeting system peripherals (e.g., memory 110, other peripherals 112) which have not yet completed. Other core domains (e.g., core domain 106) and other circuits and functional blocks (e.g., controller 108, memory 110, and other peripherals 112) may operate normally while core domain 104 is in the safe mode. Waveform labeled TRANS depicts a number of outstanding transactions. For example, at clock cycle 5, three outstanding transactions are remaining when CORE1 and CORE2 entered the safe mode. At clock cycle 8, CORE1 and CORE2 have completed two transactions with one transaction remaining as shown in the TRANS waveform. At clock cycle 9, all outstanding transactions have been completed as indicated by 0 (zero) in the TRANS waveform. After outstanding transactions have been completed, C1RDY and C2RDY signals are asserted at clock cycle 10.

Figure 4:
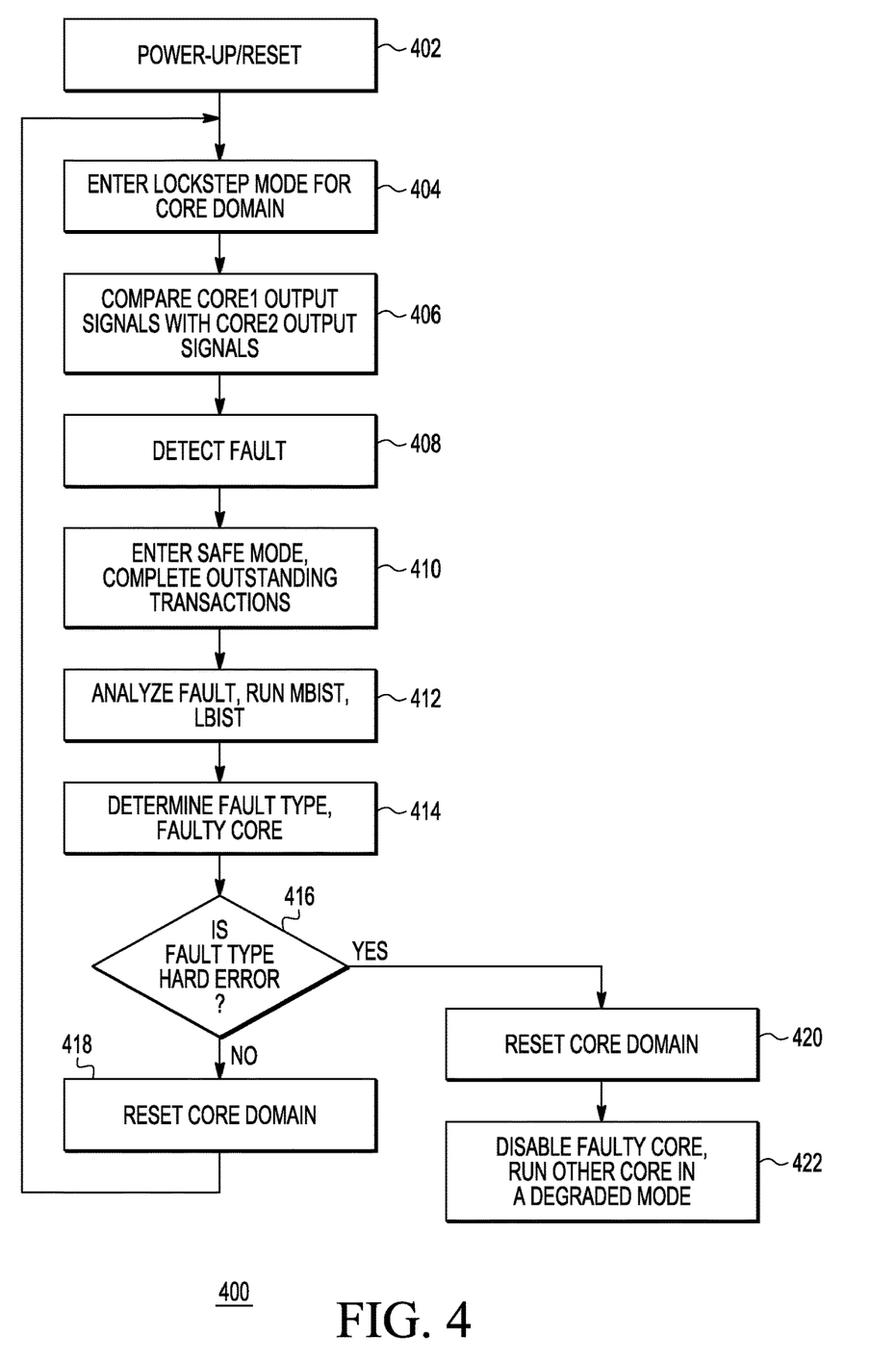
FIG. 4 illustrates, in flow chart diagram form, exemplary lockstep fault flow in accordance with an embodiment of the present invention.

FIG. 4 illustrates, in flow chart diagram form, a simplified lockstep fault flow in accordance with an embodiment of the present invention. Exemplary lockstep operation corresponding to the blocks and circuitry depicted in FIG. 1 and FIG. 2 is described in the following steps.

At step 402, power-up core domain 104. During power-up of core domain 104, each of CORE1 and CORE2, lockstep control block 108, associated memories, and other core domain circuitry is reset. After power-up and reset of the core domain 104, CORE1 and CORE2 can begin execution independently. Because core domain 104 may be a portion of a system-on-chip (SoC) or the like, core domain 104 may be powered-up during power-up of the SoC. Likewise, core domain 104 may be reset during a reset operation of the SoC (e.g., power-on reset).

At step 404, enter lockstep mode for core domain 104. Controller 108 provides one or more control signals to core domain 104 to cause CORE1 and CORE2 along with lockstep control block 118 to operate in the lockstep mode. Control signals such as LS, SEL1, and SEL2 are used to configure signal flow to/from respective cores, and control signals such as DLYI and DLYO are used to configure respective signal delay amounts from 0 (zero) clock cycle delay to N number of clock cycle delays.

For example, in the lockstep mode, control signal LS is used to route signals C1IND to C2INX as CORE2 input signals by way of multiplexer 202. Because CORE1 and CORE2 receive the same input signals (e.g., instructions) in the lockstep mode, CORE1 and CORE2 are expected to execute the same operations and provide the same output signals unless a fault occurs. Control signal SEL1 is used to route C1OUT signals to C1OUTX as CORE1 output signals by way of multiplexer 204, and control signal SEL2 is used to inhibit C2OUT signals from being routed outside of the core domain 104 by way of multiplexer 206. Control signal DLYI is used to select a delay amount (e.g., one clock cycle) by which delay circuit 210 delays C1IN signals to form C1IND signals. Likewise, control signal DLYO is used to select a delay amount (e.g., one clock cycle) by which delay circuit 208 delays C1OUT signals to form C1OUTD signals.

At step 406, compare CORE1 output signals with CORE2 output signals. CORE1 output signals C1OUT are delayed (e.g., one cycle) to form C1OUTD signals to temporally align CORE1 with CORE2 output signals. Accordingly, C1OUTD signals are compared with CORE2 output signals C2OUT in compare unit 212. C1OUTD and C2OUT signals may each include tens or hundreds of individual signals. Circuitry of the compare unit 212 is configured to individually compare each of the tens or hundreds of C1OUTD signals with respective C2OUT signals in one clock cycle. A fault may occur in which one of the signals in the C1OUTD signals is different from a corresponding signal in the C2OUT signals. The fault may correspond to a soft error or a hard error. The soft error or hard error is generally associated with CORE1 or CORE2 circuitry and periphery thereof (e.g., cache memory). When a fault is detected, a fault indication is generated in the form of a flag, signal, and/or interrupt request and is received at controller 108.

At step 408, detect fault and generate fault indication. A fault is detected by the compare unit 212 when one of the signals in the C1OUTD signals is different from a corresponding signal in the C2OUT signals. The fault may occur as a result of a hard error or a soft error. A hard error may also be referred to as a permanent error (e.g., electrical over-stress or latent defect). A soft error may also be referred to as a transient error (e.g., electromagnetic interference, alpha particles, or voltage spikes) that does not damage the device. In turn, a fault indication is generated in the form of a flag, signal, and/or interrupt request.

At step 410, enter safe mode and complete outstanding transactions. Responsive to the fault indication, core domain 104 enters the safe mode. While in the safe mode, CORE1 and CORE2 are isolated from system bus 102 and any outstanding transactions are completed. Core domain 106 may continue processing transactions and other portions of processing system 100 may continue normal operation while core domain 104 is in the safe mode. When all outstanding transactions are completed, an interrupt request is transmitted to controller 108 for further action.

At step 412, analyze fault by performing tests such as memory built-in self-test (MBIST), logic built-in self-test (LBIST), and the like. When the interrupt request is received at controller 108, an interrupt service routine (ISR) is initiated or other software routine begins execution at controller 108 to analyze the fault. For example, MBIST is performed on memories (e.g., cache) coupled to each of CORE1 and CORE2. When MBIST is completed, LBIST is performed on each of CORE1 and CORE2. In some embodiments, other tests may be performed to determine which, if any, core or core peripheral is faulty.

At step 414, determine fault type and which core, if any, is faulty. After the fault is analyzed, a fault type may be determined (e.g., soft error or hard error). When MBIST fails or LBIST fails, the fault type is characterized as a hard error. To identify which core is faulty, the hard error may correspond to an error with either of CORE1 or CORE2 or a memory (e.g., cache) error associated with CORE1 or CORE2. For example, a cache memory error associated with CORE1 may be characterized as a hard error, and because the cache memory error is associated with CORE1, CORE1 is considered the faulty core. When MBIST and LBIST pass, the fault type is characterized as a soft error.

At step 416, determine whether the fault type is characterized as a hard error. When the fault type is not characterized as a hard error, the fault type may be considered a soft error and flow continues at step 418. When the fault type is characterized as a hard error, the flow continues at step 420.

At step 418, core domain 104 is reset. When a soft error is determined, the core domain 104 is reset. Core domain 106 and other portions of processing system 100 may continue normal operation while core domain 104 is being reset. Upon completion of core domain 104 reset, safe mode is exited. After core domain 104 is reset, flow continues by entering lockstep mode at step 404.

At step 420, core domain 104 is reset. When a hard error is determined, the core domain 104 is reset. Core domain 106 and other portions of processing system 100 may continue normal operation while core domain 104 is being reset. Upon completion of core domain 104 reset, safe mode is exited and flow continues by entering a degraded mode at step 422.

At step 422, disable faulty core and run other core in the degraded mode. Because the fault corresponded to a hard error, one of CORE1 and CORE2 is identified as the faulty core and the other core is configured along with the lockstep control block 118 to operate in a degraded mode of operation (e.g., without the safety assured when in the lockstep mode). For example, based upon the fault corresponding to a hard error and CORE2 being identified as the faulty core, CORE1 resumes executing instructions and CORE2 is inhibited from executing instructions.

Generally, there is provided, a method of operating a data processing system including detecting a fault by comparing output signals from a first processing core and a second processing core; entering a safe mode based upon detecting the fault; completing transactions while in the safe mode; determining whether the fault corresponds to a hard error; and based upon the fault corresponding to a hard error: identifying one of processing cores as a faulty core, the faulty core associated with the hard error; and inhibiting the faulty core from executing instructions and allowing the other processing core to resume executing instructions. The method may further include operating the first processing core and the second processing core in a lockstep mode, the second processing core shadowing the first processing core. The method may further include receiving at a controller an interrupt signal corresponding to the fault, and responsive to the interrupt signal, invoking a service routine to analyze the fault. The determining whether the fault corresponds to a hard error may further include performing a memory built-in self-test (MBIST) on at least one of a first cache memory coupled to a first processor of the first processing core and a second cache memory coupled to a second processor of the second processing core; and performing a logic built-in self-test (LBIST) on at least one of the first processor and the second processor. The hard error may be determined when the MBIST or LBIST fails. The method may further include coupling a first core domain to a system bus of the data processing system, the core domain comprising the first processing core and the second processing core. The safe mode may include isolating the first processing core and the second processing core from the system bus. The method may further include based upon the fault not corresponding to a hard error, resetting the first core domain, other portions of the processing system continue normal operation during reset of the first core domain. Detecting the fault by comparing output signals may include delaying output signals from the first processing core to temporally align with output signals from the second processing core.

In another embodiment, there is provided, a processing system including a core domain coupled to a system bus, the core domain includes a first processing core comprising a first processor coupled to a first cache memory, a second processing core comprising a second processor coupled to a second cache memory, and a lockstep control circuit coupled to the first processing core and the second processing core, the lockstep control circuit configured to detect a fault by comparing output signals from the first processing core and the second processing core, enter a safe mode based upon the detected fault, and complete transactions while in the safe mode; and a controller coupled to the lockstep control circuit, the controller configured to determine whether the fault corresponds to a hard error, and responsive to the fault corresponding to the hard error, allow one of the first processing core and second processing core not associated with the hard error to continue executing instructions. The lockstep control circuit may include a compare circuit, the compare circuit configured to detect a fault when output signals from the first processing core and the second processing core do not match. The safe mode may include isolation of the first processing core and the second processing core from the system bus. The controller may be configured to receive an interrupt signal corresponding to the fault, and responsive to the interrupt signal, invokes a service routine to analyze the fault. The service routine to analyze the fault may include a memory built-in self-test (MBIST) to be executed on at least one of the first cache memory and the second cache memory, and a logic built-in self-test (LBIST) to be executed on at least one of the first processor and the second processor. Based upon the fault not corresponding to a hard error, the controller may be configured to reset first core domain and allow other portions of the processing system continue normal operation during reset of the core domain.

In yet another embodiment, there is provided, a method of operating a data processing system including operating a core domain in a lockstep mode, the core domain comprising a first processing core shadowing a second processing core; detecting a fault by comparing output signals from the first processing core and the second processing core; entering a safe mode based upon detecting the fault, the safe mode isolating the core domain from a system bus; determining whether the fault corresponds to a hard error; identifying one of processing cores as a faulty core, the faulty core associated with the hard error; based upon the fault corresponding to a hard error, inhibiting the faulty core from executing instructions and allowing the processing core not associated with the hard error to resume executing instructions. Detecting the fault by comparing output signals may include delaying output signals from the second processing core to temporally align with output signals from the first processing core. The method may further include generating an interrupt signal corresponding to the fault, and responsive to the interrupt signal at a controller, invoking a service routine to analyze the fault. Determining whether the fault corresponds to a hard error may further include performing a memory built-in self-test (MBIST) on at least one of a first cache memory coupled to a first processor of the first processing core and a second cache memory coupled to a second processor of the second processing core; and performing a logic built-in self-test (LBIST) on at least one of the first processor and the second processor; wherein the hard error is determined when the MBIST or LBIST fails. The method may further include based upon the fault not corresponding to a hard error, resetting the core domain and allowing other portions of the data processing system continue normal operation during reset of the core domain.

Therefore, by now it can be appreciated that there has been provided, a data processing system and method for operating in a lockstep mode. Output signals from two processing cores of a core domain are compared during a lockstep mode. When a fault is detected, the core domain enters a safe mode and a determination is made whether the fault is caused by a soft error or a hard error. While in the safe mode, the core domain is isolated from a system bus of the data processing system and outstanding transactions are completed. The fault is analyzed by performing a memory built-in self-test (MBIST) on a cache memory coupled to a processor of each processing core and a logic built-in self-test (LBIST) on the processor of each processing core. A hard error is determined when MBIST or LBIST fails and a soft error is determined when MBIST and LBIST both pass. When a hard error is determined, fault analysis also identifies which core is a faulty core.

Based upon the fault corresponding to hard error, the faulty core is inhibited and the non-faulty core is allowed to continue operation. By inhibiting the faulty core and allowing the non-faulty core to continue executing, the data processing system can continue operation in a reduced or degraded operating mode which is desirable in a safety application. Based upon the fault corresponding to a soft error, a reset of the core domain is performed while other portions of the data processing system are allowed to operate normally. Because the reset of the core domain does not impact other portion of the data processing system, significant downtime savings can be achieved which is also desirable in a safety application.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary data processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of data processing system 100 are circuitry located on a single integrated circuit or within a same device.

Alternatively, data processing system 100 may include any number of separate integrated circuits or separate devices interconnected with each other.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operating a data processing system comprising:
    receiving, from a lockstep control circuit, a first input signal at a first processing core and a second input signal at a second processing core, the first input signal and the second input signal being used to generate a first output signal and a second output signal of output signals;
    providing the first output signal and the second output signal that are generated based on the first input signal and the second input signal to a comparator in order to detect a fault between the first output signal and the second output signal;
    detecting the fault by comparing the first output signal and the second output signal of the output signals from the first processing core and the second processing core;
    entering a safe mode based upon detecting the fault;
    completing transactions while in the safe mode;
    determining whether the fault corresponds to a hard error; and
    based upon the fault corresponding to a hard error:
        identifying one of processing cores as a faulty core, the faulty core associated with the hard error; and
        inhibiting the faulty core from executing instructions and allowing the other processing core to resume executing instructions.

2. The method of claim 1, further comprising operating the first processing core and the second processing core in a lockstep mode, the second processing core shadowing the first processing core.

3. The method of claim 1, further comprising receiving at a controller an interrupt signal corresponding to the fault, and responsive to the interrupt signal, invoking a service routine to analyze the fault.

4. The method of claim 1, wherein determining whether the fault corresponds to a hard error further comprises:
    performing a memory built-in self-test (MBIST) on at least one of a first cache memory coupled to a first processor of the first processing core and a second cache memory coupled to a second processor of the second processing core; and
    performing a logic built-in self-test (LBIST) on at least one of the first processor and the second processor.

5. The method of claim 4, wherein the hard error is determined when the MBIST or LBIST fails.

6. The method of claim 1, further comprising coupling a first core domain to a system bus of the data processing system, the core domain comprising the first processing core and the second processing core.

7. The method of claim 6, wherein the safe mode comprises isolating the first processing core and the second processing core from the system bus.

8. The method of claim 6, further comprising based upon the fault not corresponding to a hard error, resetting the first core domain, other portions of the processing system continue normal operation during reset of the first core domain.

9. The method of claim 1, wherein detecting the fault by comparing output signals comprises delaying output signals from the first processing core to temporally align with output signals from the second processing core.

10. A data processing system comprising:
    a core domain coupled to a system bus, the core domain comprising:
        a first processing core comprising a first processor coupled to a first cache memory,
        a second processing core comprising a second processor coupled to a second cache memory, and
        a lockstep control circuit coupled to the first processing core and the second processing core, the lockstep control circuit configured to provide input signals to the first processing core and the second processing core, the input signals being a first input signal and a second input signal that are used to generate a first output signal and a second output signal of output signals, the first output signal and the second output signal that are generated based on the first input signal and the second input signal are provided to a comparator in order to detect a fault between the first output signal and the second output signal and detect the fault by comparing the first output signal and the second output signal of the output signals from the first processing core and the second processing core, enter a safe mode based upon the detected fault, and complete transactions while in the safe mode; and
    a controller coupled to the lockstep control circuit, the controller configured to determine whether the fault corresponds to a hard error, and responsive to the fault corresponding to the hard error, allow one of the first processing core and second processing core not associated with the hard error to continue executing instructions.

11. The system of claim 10, wherein the lockstep control circuit comprises a compare circuit, the compare circuit configured to detect a fault when output signals from the first processing core and the second processing core do not match.

12. The system of claim 10, wherein the safe mode comprises isolation of the first processing core and the second processing core from the system bus.

13. The system of claim 10, wherein the controller is configured to receive an interrupt signal corresponding to the fault, and responsive to the interrupt signal, invokes a service routine to analyze the fault.

14. The system of claim 13, wherein the service routine to analyze the fault comprises a memory built-in self-test (MBIST) to be executed on at least one of the first cache memory and the second cache memory, and a logic built-in self-test (LBIST) to be executed on at least one of the first processor and the second processor.

15. The system of claim 10, wherein based upon the fault not corresponding to a hard error, the controller is configured to reset first core domain and allow other portions of the processing system continue normal operation during reset of the core domain.

16. A method of operating a data processing system comprising:
   operating a core domain in a lockstep mode, the core domain comprising a first processing core shadowing a second processing core;
   receiving, from a lockstep control circuit, a first input signal at a first processing core and a second input signal at a second processing core, the first input signal and the second input signal being used to generate a first output signal and a second output signal of output signals;
   providing the first output signal and the second output signal that are generated based on the first input signal and the second input signal to a comparator in order to detect a fault between the first output signal and the second output signal;
   detecting the fault by comparing the first output signal and the second output signal of the output signals from the first processing core and the second processing core;
   entering a safe mode based upon detecting the fault, the safe mode isolating the core domain from a system bus;
   determining whether the fault corresponds to a hard error;
   identifying one of processing cores as a faulty core, the faulty core associated with the hard error; and
   based upon the fault corresponding to a hard error, inhibiting the faulty core from executing instructions and allowing the processing core not associated with the hard error to resume executing instructions.

17. The method of claim 16, wherein detecting the fault by comparing output signals comprises delaying output signals from the second processing core to temporally align with output signals from the first processing core.

18. The method of claim 16, further comprising generating an interrupt signal corresponding to the fault, and responsive to the interrupt signal at a controller, invoking a service routine to analyze the fault.

19. The method of claim 16, wherein determining whether the fault corresponds to a hard error further comprises:
   performing a memory built-in self-test (MBIST) on at least one of a first cache memory coupled to a first processor of the first processing core and a second cache memory coupled to a second processor of the second processing core; and
   performing a logic built-in self-test (LBIST) on at least one of the first processor and the second processor;
   wherein the hard error is determined when the MBIST or LBIST fails.

20. The method of claim 16, further comprising based upon the fault not corresponding to a hard error, resetting the core domain and allowing other portions of the data processing system continue normal operation during reset of the core domain.

* * * * *